United States Patent
Wang et al.

(10) Patent No.: US 7,124,806 B1
(45) Date of Patent: Oct. 24, 2006

(54) HEAT SINK FOR ENHANCED HEAT DISSIPATION

(75) Inventors: David G. Wang, San Diego, CA (US); P. Keith Muller, San Diego, CA (US)

(73) Assignee: NCR Corp., Dayton, OH (US)

( * ) Notice: Subject to any disclaimer, the term of this patent is extended or adjusted under 35 U.S.C. 154(b) by 0 days.

(21) Appl. No.: 10/016,624

(22) Filed: Dec. 10, 2001

(51) Int. Cl.
*F28F 7/00* (2006.01)

(52) U.S. Cl. ............ 165/80.3; 165/185; 165/104.33; 361/700; 257/714; 257/715

(58) Field of Classification Search ........... 165/80.3, 165/104.14, 104.26, 104.33, 121, 122; 361/700; 257/715; 174/15.2
See application file for complete search history.

(56) References Cited

U.S. PATENT DOCUMENTS

| | | | |
|---|---|---|---|
| 3,149,666 A | 9/1964 | Coe | |
| 3,342,255 A | 9/1967 | Risk et al. | |
| 3,739,234 A | 6/1973 | Bylund et al. | |
| 4,295,067 A | 10/1981 | Binder et al. | |
| 5,535,094 A | 7/1996 | Nelson | |
| 5,768,483 A | 6/1998 | Maniwa et al. | |
| 5,778,970 A | 7/1998 | Chang | |
| 5,959,837 A | 9/1999 | Yu | |
| 5,983,995 A * | 11/1999 | Shutou et al. | 165/104.33 |
| 6,041,850 A | 3/2000 | Esser et al. | |
| 6,102,110 A * | 8/2000 | Julien et al. | 165/104.33 |
| 6,105,662 A | 8/2000 | Suzuki | |
| 6,125,035 A | 9/2000 | Hood, III et al. | |
| 6,137,682 A | 10/2000 | Ishimine et al. | |
| 6,144,553 A * | 11/2000 | Hileman et al. | 361/687 |
| 6,152,213 A * | 11/2000 | Suzuki | 165/104.33 |
| 6,152,369 A | 11/2000 | Wilz, Sr. et al. | |
| 6,169,660 B1 | 1/2001 | Sarraf et al. | |
| 6,196,302 B1 | 3/2001 | Chuang | |
| 6,227,286 B1 | 5/2001 | Katsui | |
| 6,229,704 B1 | 5/2001 | Hoss et al. | |
| 6,288,895 B1 | 9/2001 | Bhatia | |
| 6,356,445 B1 | 3/2002 | Mochzuki | |
| 6,374,905 B1 * | 4/2002 | Tantoush | 165/80.3 |
| 6,407,916 B1 | 6/2002 | Konstad | |
| 6,408,935 B1 * | 6/2002 | DeHoff et al. | 165/80.3 |
| 6,422,303 B1 | 7/2002 | Ishida et al. | |
| 6,437,983 B1 | 8/2002 | Machiroutu et al. | |
| 6,549,408 B1 | 4/2003 | Berchowitz | |
| 6,557,626 B1 | 5/2003 | O'Sullivan et al. | |
| 6,587,735 B1 | 7/2003 | Yaguchi | |

(Continued)

FOREIGN PATENT DOCUMENTS

JP    8-046101    2/1996

(Continued)

OTHER PUBLICATIONS

Thermacore International, Inc., Heat Pipe Technology, How it Works, 1 page (dated at least as early as Nov. 15, 2001).

(Continued)

*Primary Examiner*—Henry Bennett
*Assistant Examiner*—Nihir Patel
(74) *Attorney, Agent, or Firm*—Trop, Pruner & Hu, P.C.

(57) ABSTRACT

A heat sink assembly includes a block formed of a thermally conductive material. For example, the thermally conductive material includes thermally conductive polymer. A heat conduit (e.g., a heat pipe) extends through a substantial portion of the block. In one example arrangement, airflow channels extend through portions of the block.

6 Claims, 4 Drawing Sheets

U.S. PATENT DOCUMENTS

| | | | |
|---|---|---|---|
| 6,651,732 B1 * | 11/2003 | Sagal | 165/80.3 |
| 6,760,222 B1 | 7/2004 | Wang | |
| 6,853,555 B1 * | 2/2005 | Fichera et al. | 361/700 |
| 6,860,321 B1 * | 3/2005 | Ji-Hai et al. | 165/80.3 |
| 6,956,740 B1 * | 10/2005 | Shimura et al. | 361/700 |
| 7,047,640 B1 * | 5/2006 | Lee et al. | 29/890.046 |
| 2003/0000689 A1 * | 1/2003 | Kuo et al. | 165/185 |
| 2003/0019610 A1 * | 1/2003 | Liu | 165/80.3 |
| 2003/0056938 A1 * | 3/2003 | McCullough | 165/80.3 |
| 2003/0075312 A1 * | 4/2003 | Panek | 165/185 |
| 2003/0128515 A1 | 7/2003 | Faneuf et al. | |

FOREIGN PATENT DOCUMENTS

| | | |
|---|---|---|
| JP | 9-098318 | 4/1997 |
| JP | 9-280758 | 10/1997 |
| JP | 10-092990 | 4/1998 |
| JP | 11-251777 | 9/1999 |
| JP | 2001-119183 | 4/2001 |
| JP | 2001-267773 | 9/2001 |

OTHER PUBLICATIONS

Thermacore International, Inc., Heat Pipe Technology, Frequently Asked Questions about Heat Pipes, pp. 1-4 (dated at least as early as Nov. 15, 2001).

* cited by examiner

HEAT SINK FOR ENHANCED HEAT DISSIPATION

BACKGROUND

Electronic devices, such as microprocessors, microcontrollers, input/output devices, and memory devices, have become increasingly more powerful. For optimal performance, such devices operate at high clock speeds. Increased speeds lead to increased power usage by devices, which in turn means that a greater amount of heat is generated by such devices during operation. An effective heat dissipation mechanism is thus needed to prevent excessive heat buildup in the devices, which may damage the devices or reduce their reliability. Operational integrity can also be adversely affected when a device is overheated.

One type of heat dissipation mechanism includes an airflow generator to force a flow of air in a system. Heat sinks are thermally contacted to heat-producing devices to increase heat dissipation with extended surface area. As heat dissipation loads of devices (such as high performance microprocessors, system controllers, and so forth) continue to increase, larger heat sinks are needed. Large heat sinks tend to be relatively heavy. This is particularly the case for large heat sinks formed of thermally conductive metals, such as copper or aluminum.

When mounted directly on components, heavy heat sinks can cause reliability problems. For example, certain types of integrated circuit (IC) packages are easily damaged by the pressure and torque applied by a heavy heat sink, both during static operating conditions and during transit conditions (e.g., shipping). Further, a heavy heat sink can damage the connection between a component and a board on which the component is mounted. Also, if several heavy heat sinks are located on a circuit board, the weight of the heat sinks can deform the circuit board, which reduces reliability of the circuit board.

Additionally, heavy heat sinks usually require relatively complex and costly retention and support mechanisms within the system. Various constraints thus serve to limit the size and weight of heat dissipation components and potentially the effectiveness of such heat dissipation components.

SUMMARY

In general, a heat sink is provided for enhanced heat dissipation while using more lightweight and cost-effective materials. For example, a heat sink assembly includes a heat conduit and a block formed of a thermally conductive material. The heat conduit extends through a substantial portion of the block.

Other or alternative features will become apparent from the following description, from the drawings, and from the claims.

DETAILED DESCRIPTION

In the following description, numerous details are set forth to provide an understanding of the present invention. However, it is to be understood by those skilled in the art that the present invention may be practiced without these details and that numerous variations or modifications from the described embodiments may be possible.

In accordance with some embodiments of the invention, heat sinks formed of relatively lightweight and cost-effective materials are used. In one embodiment, the lightweight material includes a non-metallic material such as thermally conductive polymer. One example of a thermally conductive polymer is COOLPOLY® from Cool Polymers Inc., in Warwick, R.I. Thermally conductive polymer can offer heat transfer capabilities comparable to some metals and ceramics. However, thermally conductive polymer is generally more lightweight than typical metals and ceramics used in heat sink applications. In addition, thermally conductive polymer is relatively cost effective. It also has the benefit of increased flexibility of use, ease of molding to a desired shape, and relatively low thermal expansion (when compared to metals).

The heat transfer capacity of thermally conductive polymer is comparable to the thermal conductivity of some metals, such as aluminum. The thermal conductivity of thermally conductive polymer can reach up to about 100 W/mK (watts per meter-kelvin). This is similar to the thermal conductivity of die-cast aluminum, and close to the thermal conductivity of extruded aluminum (conductivity of about 160 W/mK). Pure copper has a thermal conductivity of about 400 W/mK.

Figure 1:
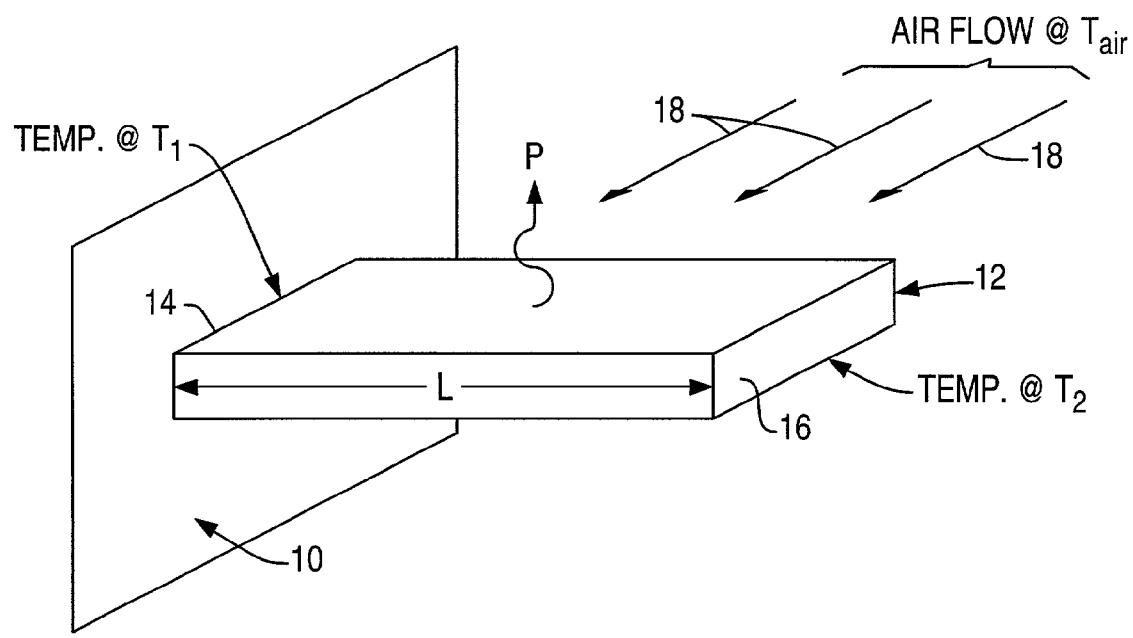
FIG. 1 illustrates a portion of a conventional heat sink.

FIG. 1 shows a conventional heat sink design, which includes a heat sink base 10 and a heat sink fin 12. A typical heat sink has a base attached to multiple heat sink fins. A first end 14 of the heat sink fin 12, which is contacted to the heat sink base 10, is at a temperature $T_1$ and a second end 16 of the heat sink fin 12 is at temperature $T_2$. As indicated by arrows 18, air flows over exposed surfaces of the heat sink fin 12. The temperature of the airflow is $T_{air}$.

Given the above parameters, the average temperature $T_{ave}$ of the heat sink fin 12 is expressed by the following equation:

$$T_{ave} = (T_1 + T_2)/2.$$

The thermal energy transferred (P) from the heat sink fin 12 is expressed by the following equation:

$$P = Ah(T_{ave} - T_{air}),$$

where A is the surface area exposed to airflow and h is the heat transfer coefficient proportional to airflow velocity. The parameter h can be viewed as the efficiency of the heat transfer process from a solid surface represented by $T_{ave}$ to fluid represented by $T_{air}$. Given the same airflow and heat sink geometry, maximum convective heat transfer is achieved when $T_{ave}$ reaches maximum, or when $T_2$ approaches $T_1$. Using a heat sink fin 12 formed of a material having high thermal conductivity reduces the temperature difference along the length (L) of the heat sink fin 12. The length L is the heat conduction distance of the heat sink fin 12.

Typically, materials with relatively low thermal conductivity, such as thermally conductive polymer, are used for low performance heat sinks used in low power usage applications. For high-power applications (e.g., a device or chip that generates more than 100 W), heat sinks formed of materials with high thermal conductivity (e.g., copper or aluminum) are typically used. However, copper is relatively expensive and can be quite heavy if the heat sink is large. A heavy heat sink adds to the weight of the overall system, and in addition, creates reliability problems due to potential damage to integrated circuit (IC) packaging, connections between IC devices and a board, and the board itself.

Assuming the heat sink fin 12 has a width (W), a height (H), and the length (L), the energy transferred by the conduction process through the heat sink fin 12 can be simplified and expressed as follows:

$$P=(W \times H)k(\Delta T/L),$$

where k is the thermal conductivity of the material, and $\Delta T$ represents $T_1-T_2$. The parameter k is the efficiency of the heat transfer process from one point or surface represented by $T_2$ to the other point or surface represented by $T_1$ through the material. L is the conduction distance from the base 10 to the outer edge 16 of the heat sink fin 12. Any temperature difference $\Delta T$ is developed across the conduction length.

Assuming the power input is known (P), then an effective temperature difference $\Delta T$ for dissipating heat generated by the power input P is as follows:

$$\Delta T = (P \times L)/(W \times H \times k) = \frac{1}{k} \times \frac{P \times L}{W \times H}.$$

According to the equation above, the conduction distance L has to change with material thermal conductivity k to maintain a fixed temperature drop $\Delta T$ when the cross-sectional area (W×H) is fixed. Generally, $\Delta T$ is increased with a decrease in k or an increase in L. The higher the conductivity k of the material (such as the conductivity of copper), the greater can be the distance L (and thus the larger the surface area exposed to airflow) to maintain the same $\Delta T$. In other words, for the heat sink fin 12 formed of a material with high thermal conductivity, the conduction distance L can be made larger to increase surface area for enhanced heat transfer.

On the other hand, for materials having relatively low thermal conductivity, such as thermally conductive polymer, the distance L has to be relatively short to maintain a target $\Delta T$. A large temperature drop across the heat sink fin 12 leads to ineffective heat dissipation. However, the problem with having a relatively short heat sink fin (L is small) is that the surface area of the heat sink fin 12 exposed to airflow is reduced and thus power dissipation is reduced.

To address these issues, an improved heat sink according to some embodiments of the invention utilizes heat pipes (or other types of heat conduits, materials, heat transfer media with high heat transfer efficiency or high effective thermal conductivity) in conjunction with a material of relatively low thermal conductivity, such as thermally conductive polymer, to achieve satisfactory heat dissipation in high performance applications. Examples of high performance applications include systems such as mainframe computers, servers, desktop systems, and other systems having chips or devices that are capable of generating greater than 100 W per device or chip. In such systems, the devices (e.g., microprocessors, system controllers, etc.) operate at relatively high frequencies, which lead to high power usage.

Note, however, that other embodiments are not necessarily limited to high power applications. Such other embodiments can be used in low power applications.

Figure 2:
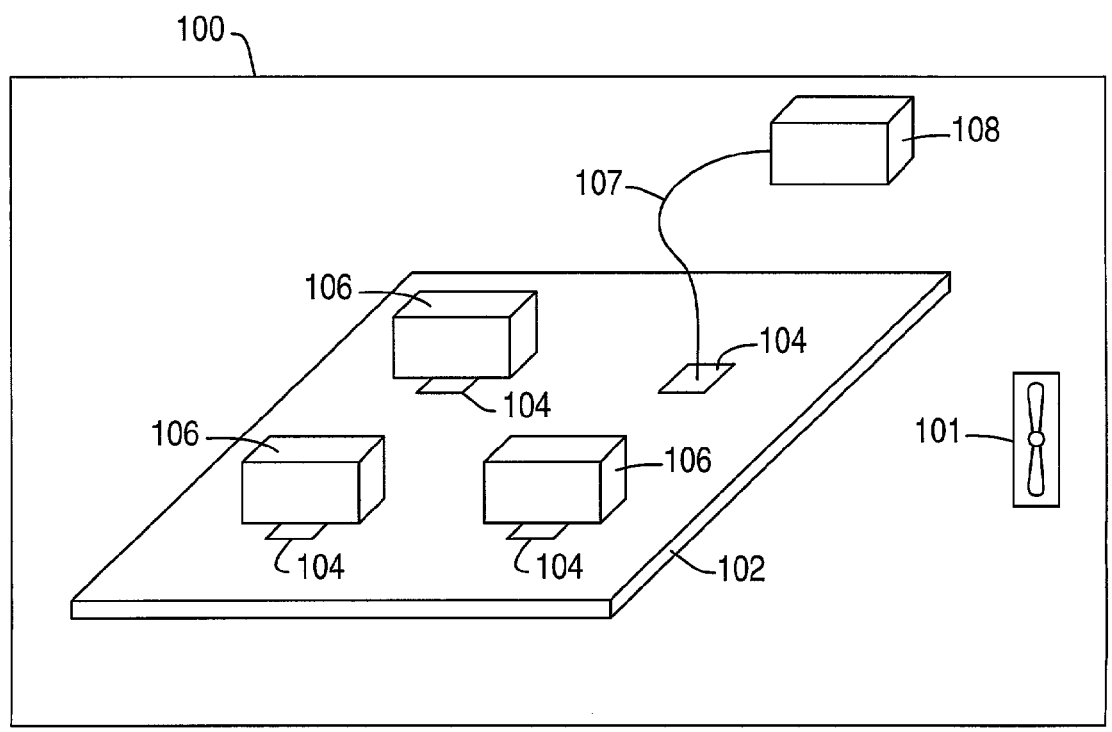
FIG. 2 illustrates an example system having heat-producing devices with heat sinks mounted on the devices.

FIG. 2 illustrates a system 100 that has a circuit board 102 with heat generating components (such as integrated circuit or IC devices) 104 mounted on the circuit board 102. To dissipate heat from such components, heat sinks 106 are mounted on the devices 104. An airflow generator 101 (e.g., a fan) generates an airflow to dissipate heat from the heat sinks 106.

In other embodiments, the heat sinks 106 do not have to be mounted on the devices 104. For example, a heat sink 108 can be remotely located with heat transferred from a device 104 to the remotely located heat sink 108, by use of a heat pipe or other heat conduit 107. The transferred heat is dissipated by the heat sink 108.

Figure 3:
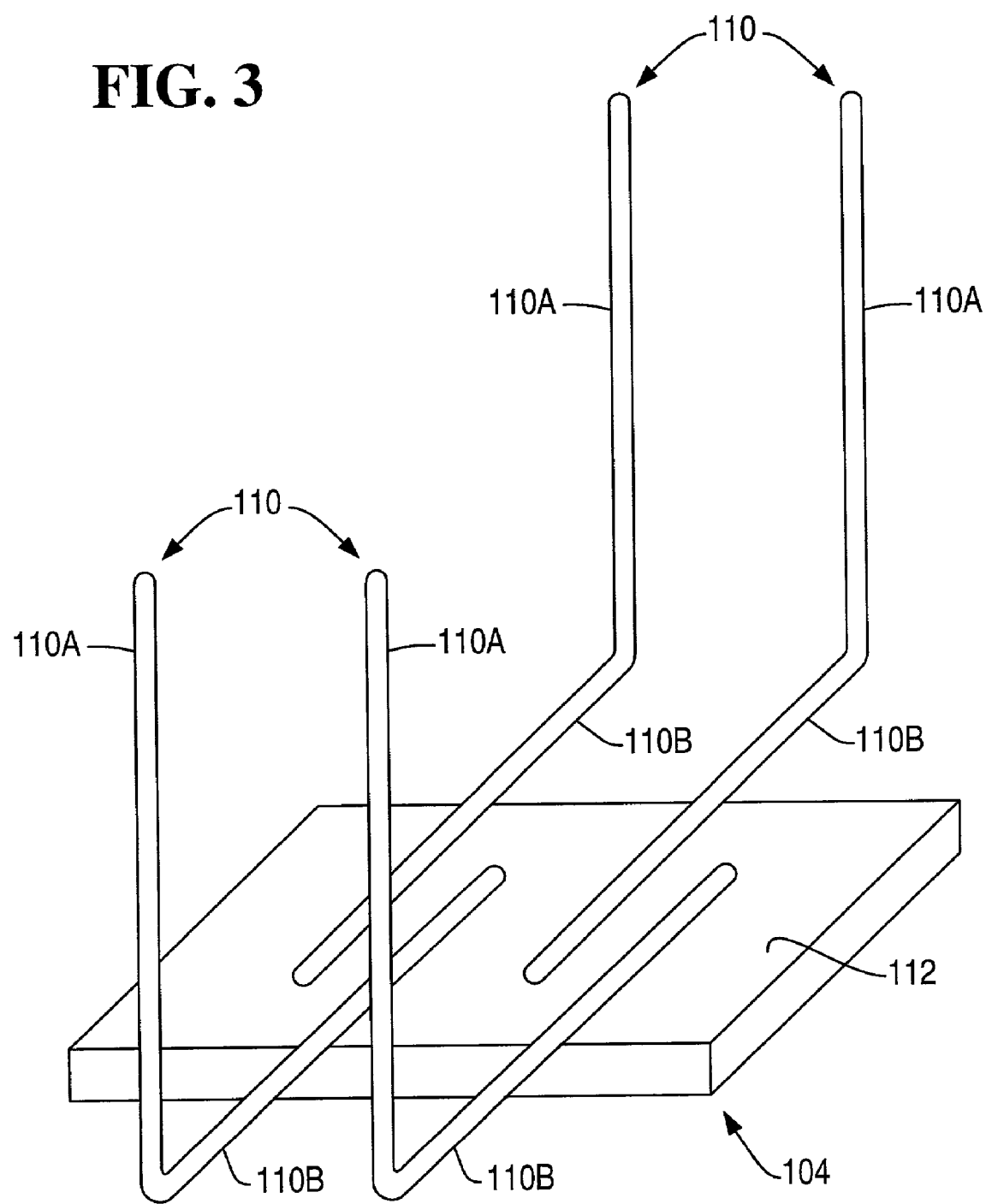
FIG. 3 is a perspective view of a portion of a heat sink in accordance with an embodiment.

FIG. 3 shows a portion of the heat sink 106. This portion includes heat pipes 110, which are thermally contacted to a heat-producing device 104. A similar arrangement can be used for the remote heat sink 108 where heat pipes 110 coincide with heat pipes 107. Each heat pipe 110 has two portions (110A and 110B), which are angled or bent with respect to each other. In the illustrated embodiment, the portions 110A and 110B are generally perpendicular to each other. However, in other embodiments, other arrangements of the heat pipe portions 110A and 110B are possible. The heat pipe portion 110B is contacted to a surface 112 of the heat-producing device 104. The heat received by the heat pipe portion 110B is transferred along the length of the heat pipe 110.

A heat pipe has very high thermal conductivity. In some cases, a heat pipe has a thermal conductivity that is several orders of magnitude higher than copper. For example, as noted above, copper has a thermal conductivity of about 400 W/mK, while a heat pipe can have a thermal conductivity of greater than 10,000 W/mK. Generally, a heat pipe is a tubular structure having an inner bore through which vapor can flow, as well as a wick structure along the inner wall of the tubular structure in which fluid travels. Combined, the movement of the vapor and fluid within the tubular structure effectively transfers heat from one end to the other. Heat pipes can also have shapes other than a tubular shape. An example heat pipe is further described below in conjunction with FIG. 6.

In an alternative embodiment, another type of heat conduit, other than the heat pipe 110, can be used. Generally, a "heat conduit" is any conduit having relatively high thermal conductivity that is able to transfer or carry heat from one point to another point. Instead of a tubular structure with an inner bore for fluid flow, as in the case of a heat pipe, other embodiments of a heat conduit include a solid rod or other elongated member formed of a material with a relatively high thermal conductivity. Thus, as shown in FIG. 3, the heat pipes 110 can be replaced with heat conduits that are solid metal rods, which can be formed of copper or other high thermal conductivity metals. Also, as used here, an "elongated heat conduit" refers to a heat conduit that is relatively long and narrow, and has a length along which heat transfer occurs.

"Thermal communication" or "thermal contact" refers to any coupling between one component and another component that enables relatively efficient transfer of heat between the components. The components can be directly thermally contacted with each other, or they may be indirectly contacted (such as through a thermally conductive layer, block, or conduit).

One characteristic of each of the heat pipes 110 shown in FIG. 3 (or other heat conduits used in place of the heat pipes) is that the temperature at one end of the heat pipe 110 is substantially the same as the temperature at the other end of the heat pipe 110. In other words, the temperature at one end of the heat pipe portion 110A (closes to a heat sauce e.g., the device 104) is substantially the same as the temperature at the other end of the heat pipe portion 110A. Thus, for purposes of this discussion, it can be assumed that the temperature along the entire length of each of the heat pipes 110 is substantially constant, with little temperature difference across the heat pipe due to its high thermal conductivity.

Figure 4:
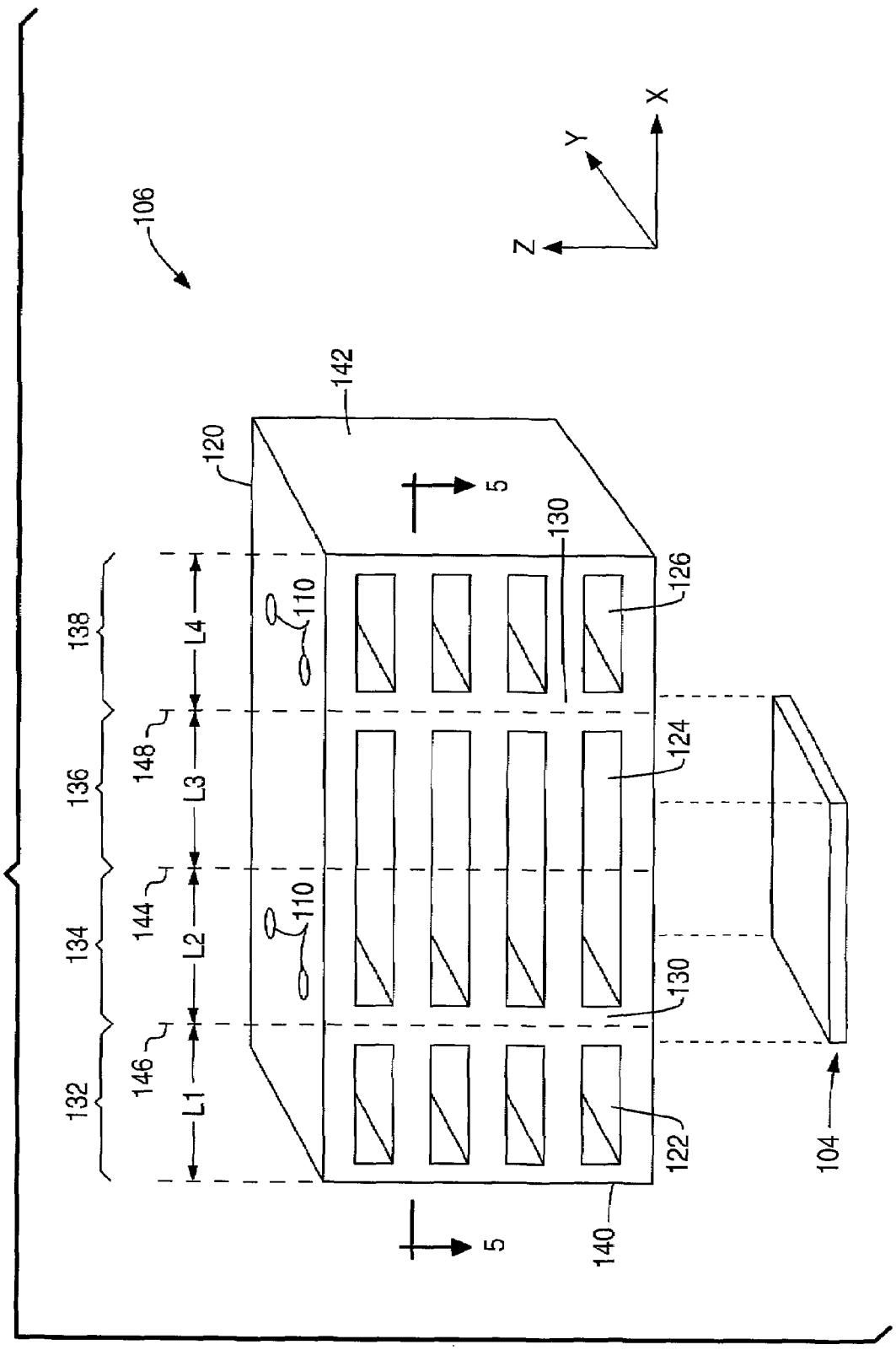
FIG. 4 is a perspective view of a fully assembled heat sink in accordance with an embodiment.

As further shown in FIG. 4, the heat pipes 110 (or portions of the heat pipes 110) are embedded in a heat sink block 120 that is formed of a material that has a thermal conductivity less than that of each heat pipe 110. One example material that can be used to form the heat sink block 120 is thermally conductive polymer. Other materials can also be used, such as aluminum, ceramics, or other metals or non-metals. Copper is also a material that can be used in other embodiments. In some embodiments, the material for the heat sink block 120 has a thermal conductivity k, where k is greater than or equal to about 10 but less than or equal to about 100. In other embodiments, the block 120 can be formed of a material with a conductivity k greater than 100 or less than 10.

In the illustrated embodiment of FIG. 4, the heat sink block 120 has airflow channels 122, 124, and 126 extending through the heat sink block 120. The inner surface of the airflow channels 122, 124, and 126 serve as extended heat transfer area $A_{ht}$. The airflow channels 122, 124, and 126 are designed to receive a flow of air generated by the airflow generator 101 (FIG. 2). The heat pipes 110 extend through support columns 130 in the heat sink block 120 between airflow channels 122, 124, and 126.

As shown, each pipe 110 extends through substantial portions of the heat sink block 120. As used here, a heat pipe or other heat conduit extending through a "substantial portion" of the block 120 refers to the heat pipe or other heat conduit extending through enough of the block 120 such that a segment of the block can be used to effectively dissipate heat from the heat pipe or other heat conduit to the airflow through extended surface area $A_{ht}$.

Figure 5:
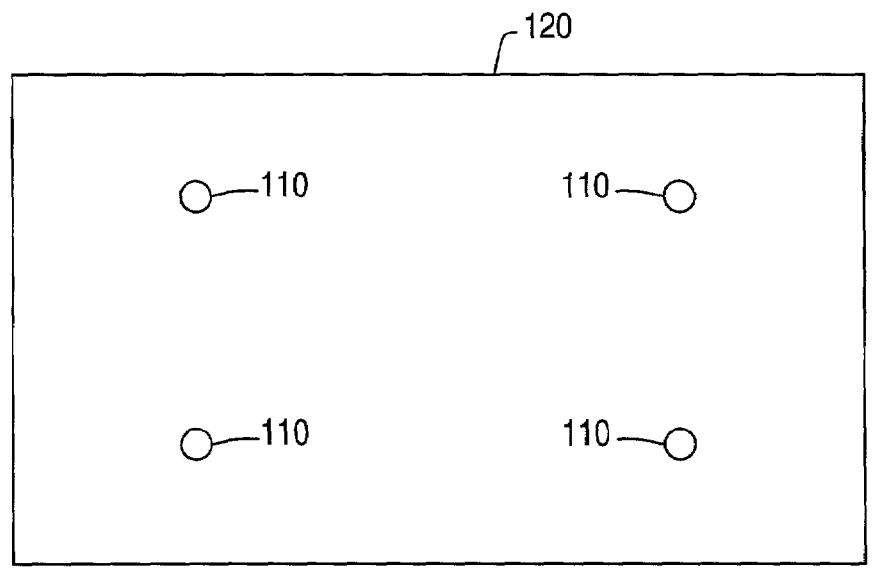
FIG. 5 is a cross-sectional view of the heat sink of FIG. 4.

A cross-sectional view of the heat sink assembly 106 is shown in FIG. 5. The cross-sectional view shows the placement of the heat pipe portions 110A within the heat sink block 120.

A benefit of the heat sink design shown in FIG. 4 is that the effective conduction distances L of segments of the heat sink block 120 are reduced, so that heat dissipation capacity is enhanced even though a material of a relatively low thermal conductivity is used. With the design shown in FIG. 4, the heat sink block 120 is effectively divided into four segments: a first segment 132, a second segment 134, a third segment 136, and a fourth segment 138. A first pair of heat pipe 110 (on the left side of the diagram) divides the first and second segments 132 and 134. A second pair of the heat pipes (on the right side of the diagram) divides the third and fourth segments 136 and 138. In each segment, the surface area $A_{ht}$ exposed to airflow is increased by using the airflow channels 122, 124, or 126.

The heat sink block 120 has two horizontal axes X and Y and a vertical axis Z. The heat pipe portions 110B extend generally in the plane formed by the horizontal axes X and Y, while the heat pipe portions 110A extend generally along the vertical axis Z. The first segment 132 is defined between a first side edge 140 of the block 120 and vertical line 146 representing where two of the heat sink portions 110B extend generally vertically. The second segment 134 is defined between the line 146 and a center vertical line 144 that divides the block 120 into two vertical halves. The third segment 136 is defined between the line 144 and a line 148 representing where two other heat sink portions 110B extend generally vertically. The fourth segment 138 is defined between the line 148 and another side edge 142 of the block 120.

The segment 132 has a conduction distance L1 from the line 146 to the outer edge 140 of the heat sink segment 132. Heat is conducted from the heat pipe portions 110B to the side edge 140. The temperature difference ΔT in the segment 132 developed across the conduction distance L1 is reduced by making L1 relatively small.

The second segment 134 has a conduction distance L2 from its base (at line 146) to the outer edge of the segment 134 (at line 144). The third segment 136 has a conduction distance L3 from its base (at line 148) to the outer edge of the segment (at line 144). The fourth segment 138 has a conduction distance L4 from its base (at line 148) to the outer edge of the segment (at edge 142).

By extending the heat pipe portions through the heat sink block 120 to divide the block 120 into segments for dissipating heat from the heat pipe portions, the conduction distances are made relatively small so that efficient heat dissipation can be achieved even with materials of relatively low thermal conductivity.

In one embodiment, the conduction distances L1, L2, L3, and L4 are made generally the same. In other embodiments, L1, L2, L3, and L4 can have different values. The heat pipe portions 110A and 110B can be in forms other than straight sections. The portions 110A and 110B may be generally S-shaped, can be formed as loops, or can have other different shapes. The portion 110B can be looped to cover a larger area of the surface 112 in the horizontal plane to maximize contact with the heat transfer area, and the portion 110A can fully extend through the three-dimensional space for the purpose of minimizing conduction distance within the block 120.

In another embodiment, the tips of the heat pipes are thermally contacted with the surface 112 of the heat source 104, with the rest of the heat pipes 110A going straight or looped inside the block 120.

Figure 6:
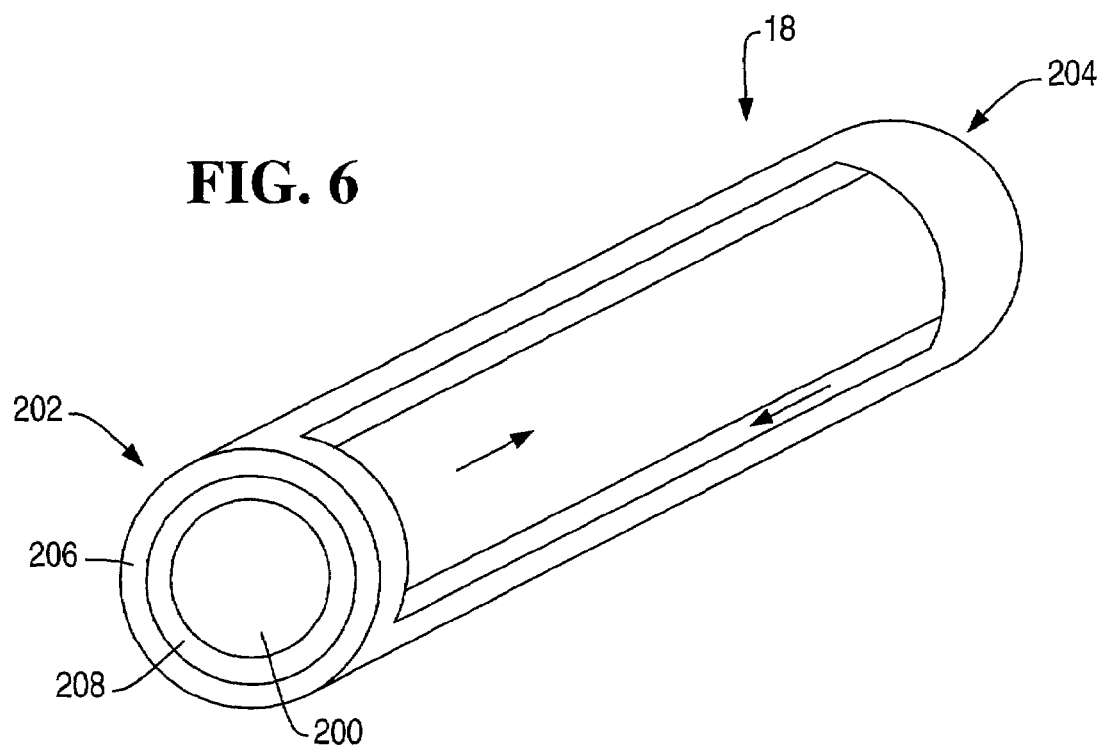
FIG. 6 illustrates an example heat pipe useable in the heat sink of FIG. 4.

FIG. 6 shows one embodiment a heat pipe 110. The heat pipe has a central bore 200 through which fluid (e.g., vapor) is able to flow. Typically, the heat pipe is sealed, with the inside of the heat pipe filled with a quantity of working fluid. The heat pipe 110 has an evaporating end 202 and a condensing end 204. The evaporating end 202 is coupled to the heat source (e.g., device 104), and the condensing end 204 is coupled to a heat dissipator (e.g., heat sink block 120).

The heat pipe 100 has an outer layer 206 formed of a thermally conductive material (e.g., copper or other thermally conductive metal or non-metal). Inside the outer layer 206 is an inner layer 208 that includes a wick structure. The wick structure can be implemented with wire meshes, sintered powders, longitudinal grooves, or screens.

The environment within the heat pipe is set by an equilibrium of liquid and vapor. In operation, vapor heated at the evaporating end 202 causes a pressure gradient to be created between the evaporating end and condensing end, which causes the vapor to flow through the bore 200 from the evaporating end 202 to the condensing end 204. Cooled liquid returns through the wick structure in the inner layer 208 from the evaporating end 204 to the evaporating end 202.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A heat sink assembly comprising:
    a heat conduit;
    a block formed of a thermally conductive non-metallic material having a first thermal conductivity,
    the heat conduit extending through a substantial portion of the block,
    the heat conduit having a second thermal conductivity greater than the first thermal conductivity,
    wherein the block has a first segment on one side of a portion of the heat conduit, and the block has a second segment on another side of the portion of the heat conduit,
    the first segment having a first heat conduction distance to dissipate heat from the heat conduit, and the second segment having a second heat conduction distance to dissipate heat from the heat conduit; and
    a second heat conduit extending through another substantial portion of the block,
    wherein the block has a third segment on one side of a portion of the second heat conduit, and the block has a fourth segment on another side of the portion of the second heat conduit,
    the third segment having a third heat conduction distance to dissipate heat from the second heat conduit, and the fourth segment having a fourth heat conduction distance to dissipate heat from the second heat conduit.

2. The heat sink assembly of claim 1, wherein the first and second heat conduction distances are substantially the same.

3. The heat sink assembly of claim 1, wherein each of the first, second, third, and fourth segments have airflow channels extending therethrough.

4. A system comprising:
    a component; and
    a heat sink thermally contacted to the component,
    the heat sink having a block formed of a thermally conductive non-metallic material, the heat sink having a first segment and a second segment,
    the heat sink further having a heat conduit extending through the block between the first and second segments, the first segment to transfer heat away from the heat conduit in a first direction, and the second segment to transfer heat away from the heat conduit in a second direction,
    wherein the block further has a third segment and a fourth segment, the heat sink further having a second heat conduit extending between the third and fourth segments.

5. The system of claim 4, wherein the thermally conductive material comprises thermally conductive polymer.

6. The system of claim 4, wherein the heat conduits comprise heat pipes.

* * * * *